United States Patent
Murakami et al.

(10) Patent No.: US 6,248,957 B1
(45) Date of Patent: Jun. 19, 2001

(54) PRINTED-CIRCUIT BOARD REINFORCING MEMBER AND A SYSTEM BOARD DEVICE HAVING THE PRINTED-CIRCUIT BOARD REINFORCING MEMBER

(75) Inventors: Hajime Murakami; Yoshihiro Morita, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/276,517

(22) Filed: Mar. 25, 1999

(30) Foreign Application Priority Data

Aug. 10, 1998 (JP) .................................................. 10-225883

(51) Int. Cl.$^7$ ...................................................... H05K 1/03
(52) U.S. Cl. .......................... 174/255; 174/15.1; 174/260
(58) Field of Search .................................... 174/252, 260, 174/15.1, 255; 361/689, 699, 700, 720, 721

(56) References Cited

U.S. PATENT DOCUMENTS 4,652,970 * 3/1987 Watari et al. ......................... 361/385
5,270,572 * 12/1993 Nakajima et al. .................... 257/714

FOREIGN PATENT DOCUMENTS

| 54-76607 | 6/1979 | (JP) . |
| 5-59881 | 8/1993 | (JP) . |
| 6-25017 | 6/1994 | (JP) . |
| 8-37348 | 2/1996 | (JP) . |
| 9-8480 | 1/1997 | (JP) . |

* cited by examiner

Primary Examiner—Jeffrey Gaffin
Assistant Examiner—Jeremy Norris
(74) Attorney, Agent, or Firm—Armstrong, Westerman, Hattori, McLeland & Naughton, LLP

(57) ABSTRACT

A printed-circuit board reinforcing member can reduce a space to be provided between an electronic part mounted on a printed-circuit board and the printed-circuit board reinforcing member fixed to the printed-circuit board. The printed-circuit board reinforcing member has a square frame shape having four side members. The electronic part having a square shape is mounted on a part of the surface of the printed-circuit board so that the part of the surface of the printed-circuit board is surrounded by the printed-circuit board reinforcing member. An inlet port is formed on a top surface of each of the side members. An outlet port is formed on an inner surface of each of the side members. A fluid passage is provided in each of the side members so as to connect the inlet port to the outlet port. Heated fluid introduced into the inlet port is discharged from the outlet port so as to heat connecting parts between the electronic part and the printed-circuit board.

10 Claims, 16 Drawing Sheets

PRINTED-CIRCUIT BOARD REINFORCING MEMBER AND A SYSTEM BOARD DEVICE HAVING THE PRINTED-CIRCUIT BOARD REINFORCING MEMBER

BACKGROUND OF THE INVENTION

1. Field of the Invention

The present invention generally relates to a system board device and, more particularly, to a printed-circuit board reinforcing member for reinforcing a printed-circuit board and a system board device using such a printed circuit board.

A large-scale computer is provided with a system board device comprising a mother bard and a plurality of daughter boards mounted on the mother board. A plurality of RAMs are mounted on each of the daughter boards. Additionally, a plurality of multi-chip modules, each of which has a pin grid-array structure, are mounted on the mother board. The multi-chip module having the pin grid-array structure is mounted on the mother board by a plurality of pins being soldered to respective terminals formed on the mother board. Such a multi-chip module has a relatively large vertical cross section having a side of which length is as long as 100 mm. Accordingly, if the mother board is warped, a displacement of the pins from the mother board is large. Thus, there is a problem in that a reliability of mounting is decreased. Additionally, In the system board device, the mother board is modified if necessary. Accordingly, the system board device preferably has a structure in which replacement of the multi-chip module and modification of the mother board are considered.

2. Description of the Related Art

FIG. 1 is a perspective view of a conventional system board device 10. In FIG. 1, the system board device 10 includes a mother board 11, a mother-board reinforcing member 12 having a square-frame shape and a multi-chip module 20. The mother-board reinforcing member 12 is fixed to a front surface of the mother board 11 in an area in which the multi-chip module 20 is placed. The mother-board reinforcing member 12 is fixed to the mother board 11 by screws 13 provided on each corner of the mother-board reinforcing member 12. Accordingly, the multi-chip module 20 having a pin grid array is located inside the mother-board reinforcing member 12. Since the mother-board reinforcing member 12 is fixed by screws 13 at each corner portion of the mother-board reinforcing member 12, an area in which the multi-chip module 20 is positioned is reinforced by the mother-board reinforcing member 12. In such a structure, the mother board 11 is hardly warped when a thermal stress is generated in the mother board 11. Thereby, soldered portions between the pins of the multi-chip module 20 and the terminals formed on the front surface of the mother board 11 are positively prevented from being destroyed.

FIG. 2 is a perspective view of another conventional system board device 30. The system board device 30 comprises the mother bard 11, a mother-board reinforcing member 31 having a square-frame shape and the multi-chip module 20 having pins 21 to be soldered to the terminals of the mother board 11. Unlike the mother-board reinforcing member 12 shown in FIG. 1, the mother-board reinforcing member 31 is fixed to a back surface of the mother board 11. The mother-board reinforcing member 31 is located in an area in which the multi-chip module 20 is mounted, and is fixed by screws 32 at each corner portion of the mother-board reinforcing member 31. That is, the mother-board reinforcing member 31 is fixed to the mother board 11 in a position opposite to the multi-chip module 20. As shown in an enlarged view in FIG. 2, each of the pins 21 is connected to the respective terminal 33 of the mother board 11 by a solder 34.

In the system board device 10 shown in FIG. 1, a space 41 is needed between the multi-chip module 20 and the mother-board reinforcing member 12 that surrounds the multi-chip module 20 so that a nozzle 40 having a square-frame shape can be inserted between the multi-chip module 20 and the mother-board reinforcing member 12 so as to blow hot air to melt a solder. Accordingly, the size of the mother-board reinforcing member 12 is increased. Thus, if a plurality of multi-chip modules 20 are mounted on the mother board 11, a distance between the adjacent multi-chip modules 20 is increased, which results in a low efficiency of mounting.

Additionally, a wire 42 for modification of the mother board 11 must run over a top surface of the mother-board reinforcing member 12, and it is difficult to fix the wire 42 to the mother board 11. Accordingly, the wire tends to be unintentionally cut off when the multi-chip module 20 is removed from the mother board 11 by using the above-mentioned nozzle 40.

On the other hand, in the system board device 30 shown in FIG. 2, since the mother-board reinforcing member 31 is mounted on the back surface of the mother board 11, a plurality of multi-chip modules can be efficiently arranged on the mother board 11. However, since the mother-board reinforcing member 31 protrudes in a direction opposite to the multi-chip module 20, an overall height H of the system board device 30 is larger than an overall height of the system module device 10 shown in FIG. 1. This is not preferable when the system board device 30 must be accommodated in a small and restricted space of a large-scale computer. Additionally, since the mother-board reinforcing member 31 is mounted on the back surface which is opposite to the front surface on which the multi-chip module 20 is mounted, a capability for restricting a warp due to a thermal stress is lower than that of the mother-board reinforcing member 12 which is mounted on the same surface on which the multi-chip module 20 is mounted. Thus, a reliability of the soldered connection between the pins 21 of the multi-chip module 20 and the terminals 33 formed on the mother board 11 is decreased.

SUMMARY OF THE INVENTION

It is a general object of the present invention to provide an improved and useful printed-circuit board reinforcing member in which the above-mentioned problems are eliminated.

A more specific object of the present invention is to provide a printed-circuit board reinforcing member which can reduce a space to be provided between an electronic part mounted on a printed-circuit board and a printed-circuit board reinforcing member fixed to the printed-circuit board.

Another object of the present invention is to provide a printed-circuit board reinforcing member which guides an electronic part to be placed at an appropriate position inside the printed-circuit board reinforcing member.

A further object of the present invention is to provide a printed-circuit board reinforcing member which can prevent a wire extending from inside the printed-circuit board reinforcing member to outside the printed-circuit board reinforcing member in a state in which the printed-circuit board reinforcing member is fixed on a printed circuit board.

In order to achieve the above-mentioned objects, there is provided according to one aspect of the present invention a printed-circuit board reinforcing member adapted to be mounted on a surface of a printed-circuit board for reinforcing a part of the printed-circuit board, the printed-circuit board reinforcing member having a square frame shape having four side members, an electronic part having a square shape being mounted on a part of the surface of the printed-circuit board so that the part of the surface of the printed-circuit board is surrounded by the printed-circuit board reinforcing member, the printed-circuit board reinforcing member comprising:

an inlet port formed on a top surface of each of the side members;

an outlet port formed on an inner surface of each of the side members; and a fluid passage provided in each of the side members so as to connect the inlet port to the outlet port, wherein heated fluid introduced into the inlet port is discharged from the outlet port so as to heat connecting parts between the electronic part and the printed-circuit board.

According to the above-mentioned invention, since the printed-circuit board reinforcing member has the nozzle structure which can direct hot air to the connecting part such as a soldered portion between the electric part and the printed-circuit board. Accordingly, there is no need to provide a space between the electronic part and the printed-circuit board reinforcing member into which space an independent nozzle is inserted for providing hot air. Thus, a distance between adjacent electronic parts can be smaller than that of the conventional structure.

The printed-circuit board reinforcing member according to the present invention may further comprise a fitting assist part formed on an inner side of each corner of the printed-circuit board reinforcing member, the fitting assist part guiding each corner of the electronic part when the electronic part is being placed inside the printed-circuit board reinforcing member so as to facilitate insertion of a positioning pin protruding from the electronic part into a positioning hole formed in the printed-circuit board.

In this invention, since each corner of the electronic part and each corner portion of the printed-circuit board can be seen from above the printed-circuit board, the electric part can be easily placed inside the printed-circuit board reinforcing member. Additionally, since the electric part is guided by each corner portions of the printed-circuit board reinforcing member, a positioning which cannot be seen from above the electronic part can be easily aligned with the positioning hole formed in the printed-circuit board which positioning hole cannot be seen from above the electric part when it is being placed inside the printed-circuit board reinforcing member.

Additionally, the printed-circuit board reinforcing member according to the present invention may further comprises at least one wire passing groove formed on a surface of the printed-circuit board reinforcing member opposite to the surface of the printed-circuit board so that a wire is extended through the wire passing groove when the wire is required to be extend from an inner side of the printed-circuit board reinforcing member to an outer side of the printed-circuit board reinforcing member.

According to this invention, the wire, which may be provided for modifying the circuit formed on the printed-circuit board, extends along the surface of the printed-circuit board its entirety. This facilitates fixation of the wire onto the printed-circuit board. Additionally, the wire is prevented from being unintentionally cut off due to accidental catch by the electronic part during, for example, an operation for replacing the electronic part since the wire does not have a part separated from the printed-circuit board.

The above-mentioned characteristic structures of the present invention can be provided to the printed-circuit board reinforcing member either alone or in combination. Additionally, there is provided according to another aspect of the present invention a system board device having the above-mentioned printed-circuit board reinforcing member according to the present invention.

Other objects, features and advantages of the present invention will become more apparent from the following detailed description when read in conjunction with the accompanying drawings.

DETAILED DESCRIPTION OF THE PREFERRED EMBODIMENTS

Figure 3:
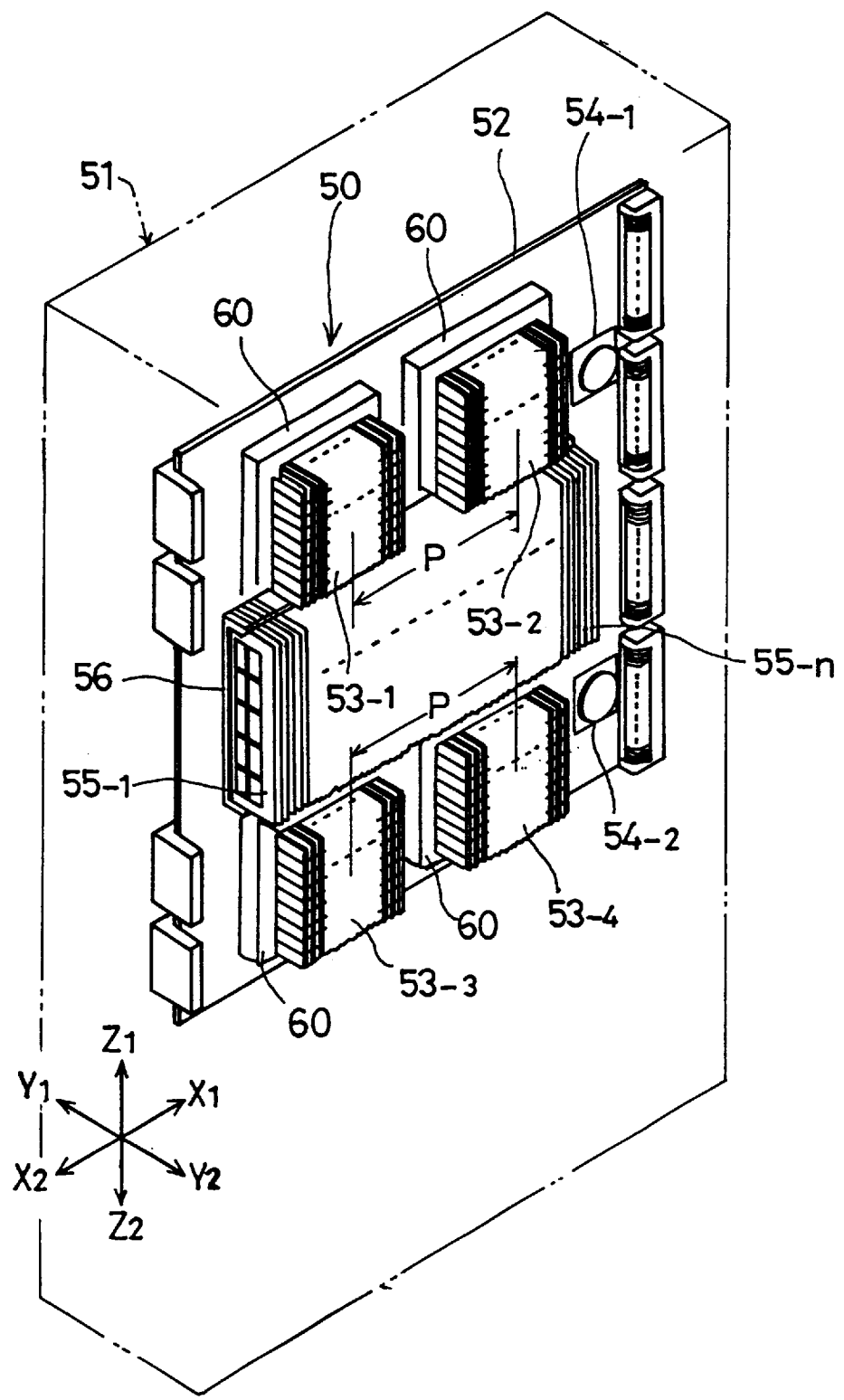
FIG. 3 is a perspective view of a system board device including a mother board on which a mother-board reinforcing member according to a first embodiment of the present invention is mounted.
Figure 4A:
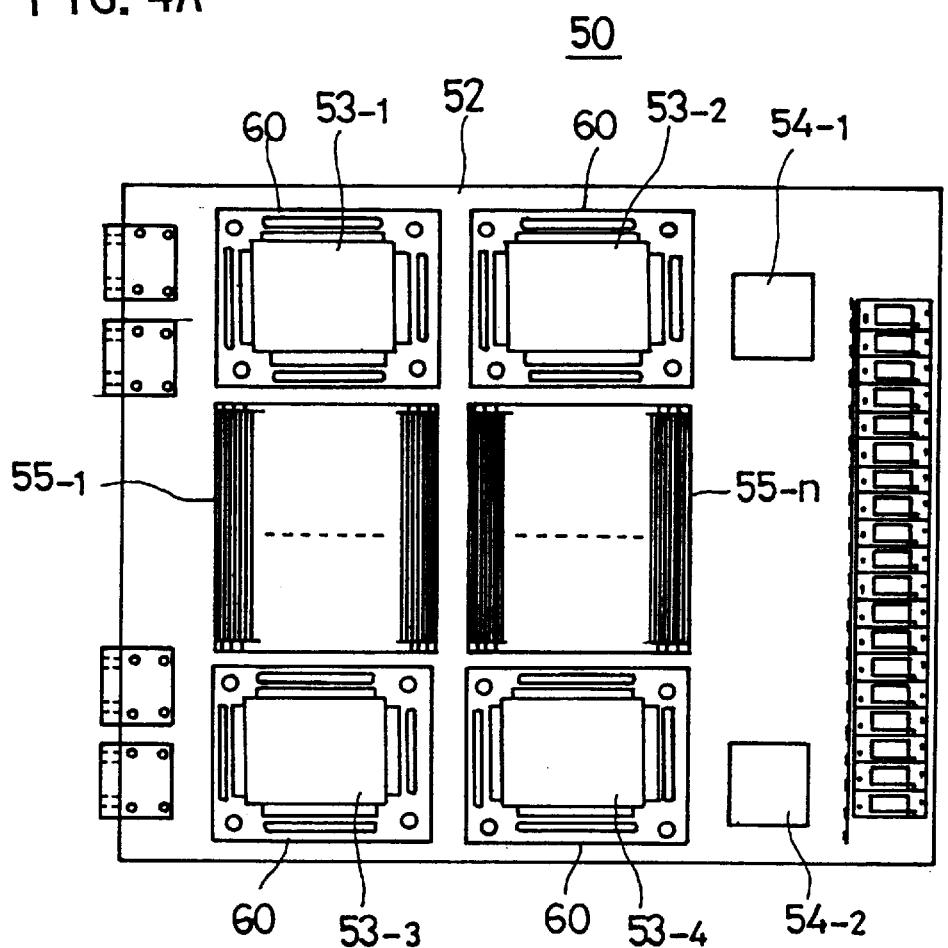
FIG. 4A is plan view of the system board device shown in FIG. 3.
Figure 4B:
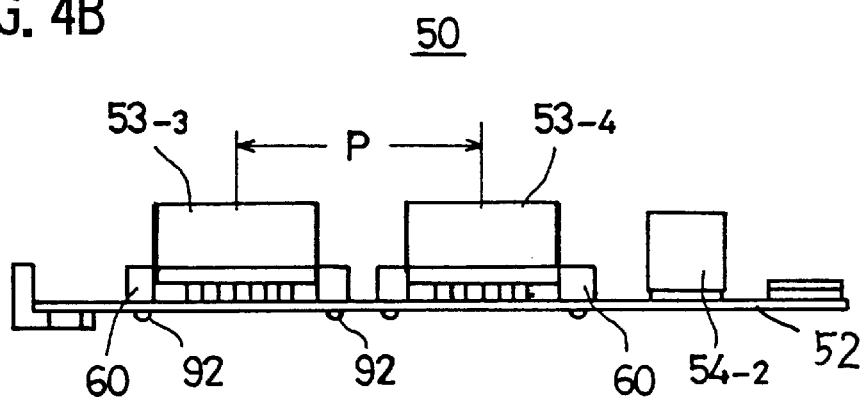
FIG. 4B is a side view of the system board device shown in FIG. 3.

A description will now be given of a first embodiment of the present invention. FIG. 3 is a perspective view of a system board device 50 including a mother board 52 on which a mother-board reinforcing member 60 according to the first embodiment of the present invention is mounted. FIG. 4A is plan view of the system board device 50 shown in FIG. 3; FIG. 4B is a side view of the system board device 50 shown in FIG. 3.

As shown in FIG. 3, the system board device 50 is provided in a large-scale computer 51 by vertical posture. In FIG. 3, directions indicated by arrows Z1 and Z2 correspond to a vertical direction (a direction of a height) of the large-scale computer 51; directions indicated by arrows Y1 and Y2 correspond to a direction of a depth of the large-scale computer 51; directions indicated by arrows X1 and X2 correspond to a direction of a width of the large-scale computer 51.

The system board device 50 includes a plurality of multi-chip modules 53-1, 53-2, 53-3 and 53-4 and electronic parts 54-1 and 54-2 all of which are mounted on the mother board 52. The system board device 50 also includes a plurality of daughter boards 55-1 to 55-n each of which is mounted on the mother bard 52 via a card-edge type socket 56.

Figure 5:
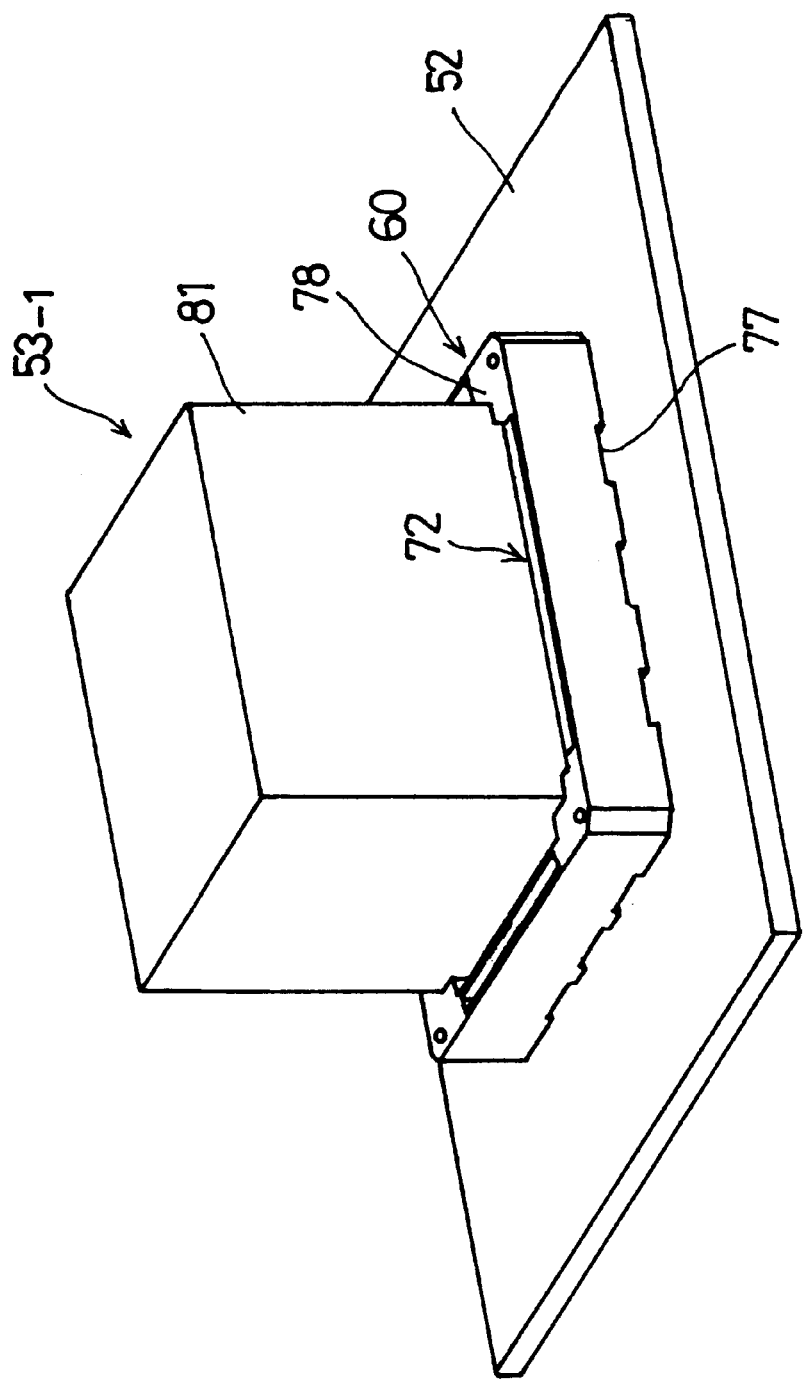
FIG. 5 is a perspective view of a part of the system board device which part includes a multi-chip module mounted on a mother bard.
Figure 6:
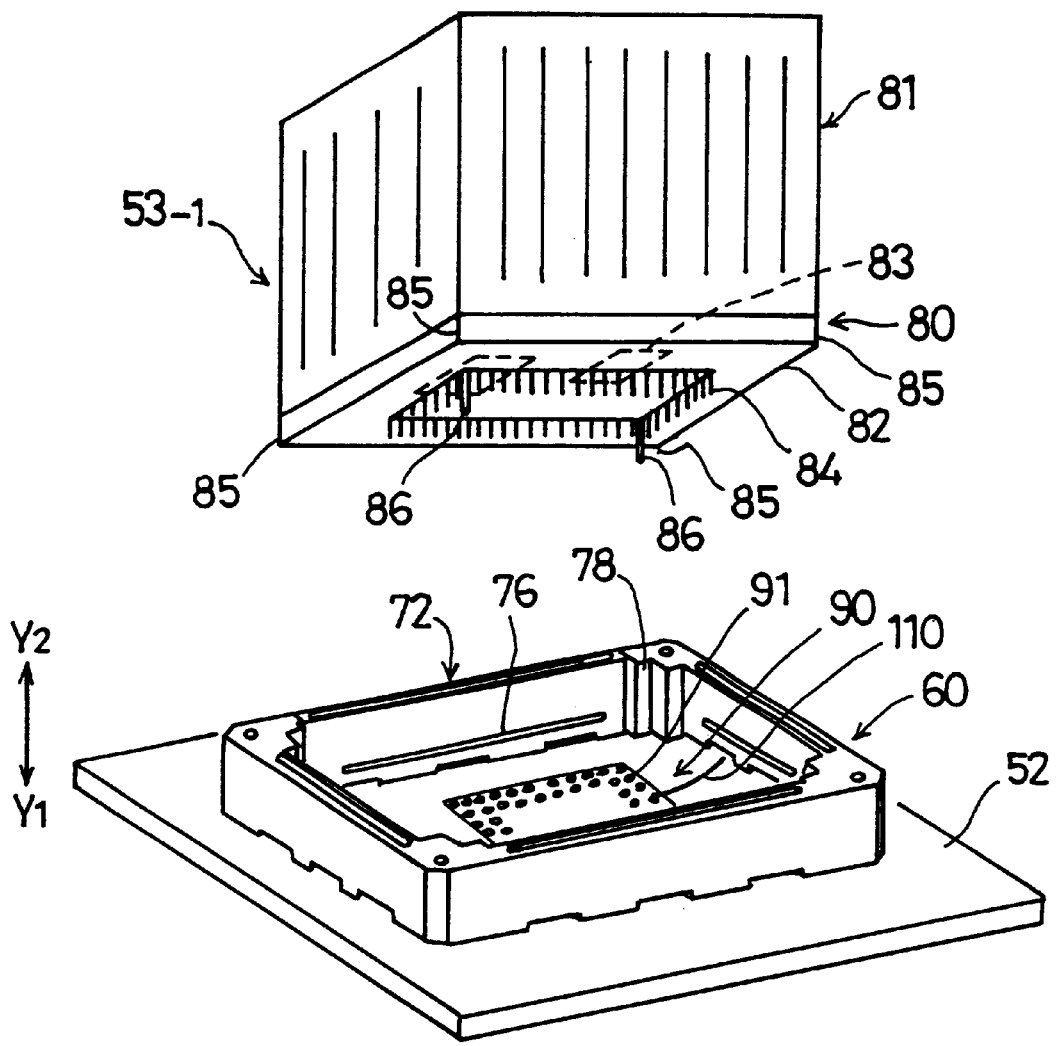
FIG. 6 is an exploded perspective view of the part of the system board device which part is shown in FIG. 5.
Figure 7A:
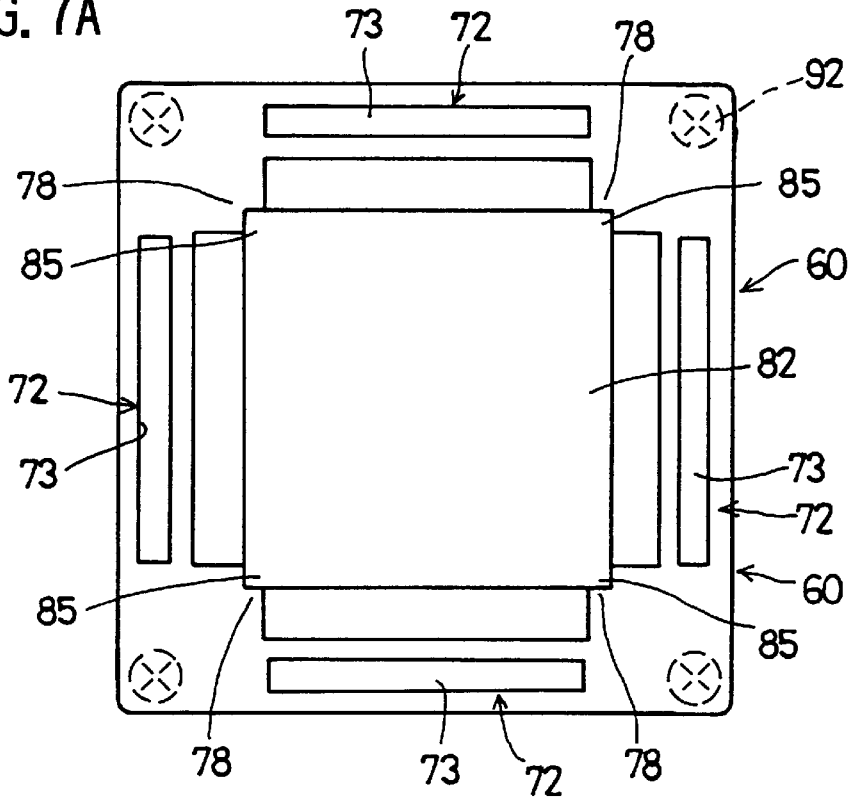
FIG. 7A is a plan view of the part of the system board device which part is shown in FIG. 5.
Figure 7B:
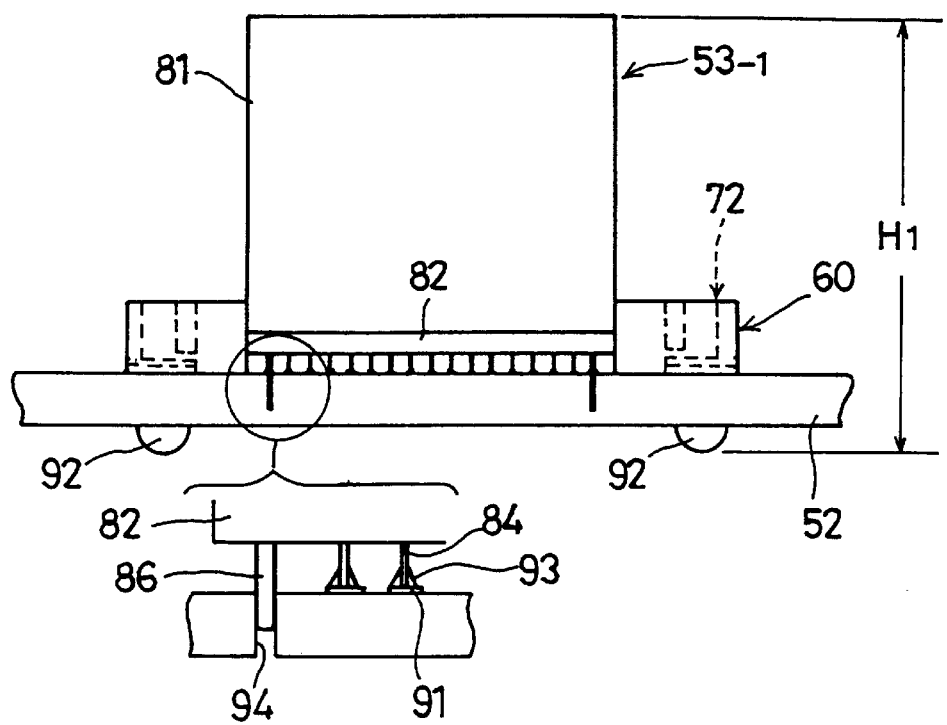
FIG. 7B is a side view of the part of the system board device which part is shown in FIG. 5.

A description will now be given of the multi-chip module 53-1. FIG. 5 is a perspective view of a part of the system board device 50 which part includes the multi-chip module 53-1 mounted on the mother bard 52. FIG. 6 is an exploded perspective view of the part of the system board device 50 which part is shown in FIG. 5. FIG. 7A is a plan view of the part of the system board device 50 which part is shown in FIG. 5; FIG. 7B is a side view of the part of the system board device 50 which part is shown in FIG. 5.

As shown in FIGS. 5, 6, 7A and 7B, the multi-chip module 53-1 is mounted to the mother board 52 by using the mother-board reinforcing member 60.

Figure 8A:
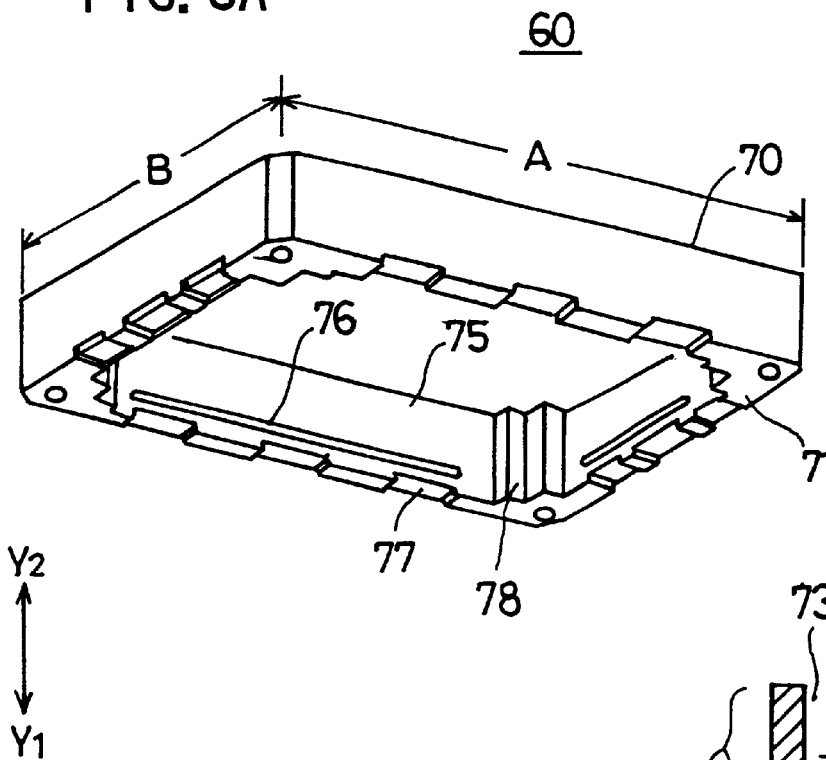
FIG. 8A is a perspective view of a mother-board reinforcing member viewed from a bottom side.
Figure 8B:
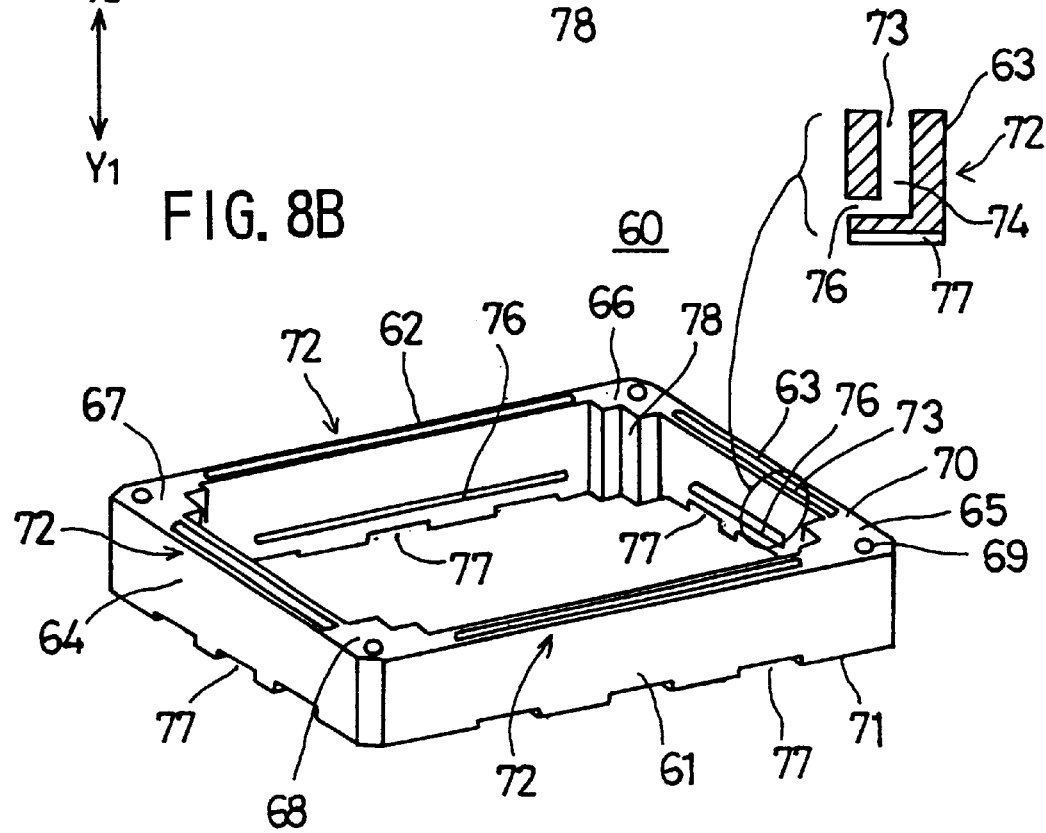
FIG. 8B is a perspective view of the mother-board reinforcing member viewed from a top side.

FIG. 8A is a perspective view of the mother-board reinforcing member 60 viewed from a bottom side; FIG. 8B is a perspective view of the mother-board reinforcing member 60 viewed from a top side. The mother-board reinforcing member 60 is made of a stainless steel, and has a square-frame shape. The mother-board reinforcing member 60 comprises four side members 61, 61, 61 and 64 and four corner portions 65, 66, 67 and 68. The inner size of the mother-board reinforcing member 60 is almost equal to the outer size of the multi-chip module 53-1, and, thus, the overall size of the mother-board reinforcing member 60 is smaller than that of the conventional mother-board reinforcing member 12 shown in FIG. 1. This is because each of the side members 61 to 64 of the mother-board reinforcing member 60 has a nozzle part 72 as explained later. In FIGS. 8A and 8B, the reference numeral 70 indicates a top surface of the mother-board reinforcing member 60 facing the direction Y2, and 71 indicates a bottom surface facing the direction Y1.

Each of the side members 61 to 64 includes the nozzle part 72. The nozzle part 72 comprises a heated fluid inlet port 73, an inner passage 74 and a heated fluid outlet port 76. The heated fluid inlet port 73 is formed on the top surface 70, and has a slit-like shape. The inner passage 74 is formed in each of the side members 61 to 64. The heated fluid output port 76 is formed on a lower part of an inner surface 75 of each of the side members 61 to 64, and has a slit-like shape.

A plurality of wire passing grooves 77 are formed on the bottom surface 71 of each of the side members 61 to 64. The wire passing grooves 77 are provided so that wires for modifying the circuit structure of the mother board 52 extend therethrough.

The mother-bard reinforcing member 60 includes a fitting assist part 78 formed on each of the corner portions 65 to 68 so as to guide each corner of the multi-chip module 53-1 when it is placed inside the mother-board reinforcing member 60. The fitting assist part 78 is provided to facilitate an operation for aligning positioning pins of the multi-chip module 53-1 with positioning holes formed in the mother board 52. Each of the fitting assist parts has a right-angle concave shape.

The multi-chip module 53-1 comprises, as shown in FIG. 6, a multi-chip module body 80 and heat-release fins 81. The multi-chip module body 80 is a pin-grid-array type in which a plurality of bare chips 83 are mounted on a top surface of a multi-layered ceramic substrate 82 and many pins 84 are arranged along a periphery of a bottom surface of the substrate 82. The multi-layered ceramic substrate 82 is a squared shape and has four corners 85. The bottom surface of the multi-layered substrate 82 is provided with the positioning pins 86 which are to be inserted into the corresponding positioning holes of the mother board 52.

In FIG. 6, indicated by the reference numeral 90 is a module mounting area in which the multi-chip module is mounted which module mounting area 90 is positioned on a front surface of the mother bard 52. Many pad terminals 91 are arranged in the are module mounting 90.

The mother-board reinforcing member 60 is fixed to the mother board 52 by screws 90 at the four corner portions 65 to 68. The screws 90 are inserted into the respective through holes formed in the mother board 52 from the back side of the mother board 52, and are screwed into the substrate 82 as shown in FIGS. 7A and 7B.

Each of the pins 84 of the multi-chip module 53-1 is connected to the respective one of the pad terminals 91 of the mother board 52 by a solder 93 as shown in FIG. 7B. The positioning pins 84 of the multi-chip module 53-1 are fit in the respective positioning holes 94 as shown in FIG. 7B (only one shown in FIG. 7B) so as to accurately position the multi-chip module relative to the mother board 52. It should be noted that other multi-chip module 53-2, 53-3 and 53-4 are mounted on the mother bard 52 in the similar manner as the multi-chip module 53-1.

The system board device 50 is subjected to a thermal stress cycle due to operations of the large-scaled computer 51 in which the system board device 50 is provided. When a temperature of the system board device 50 is increased, a thermal stress is generated in the module mounting area 90 of the mother board 52 due to a difference in coefficients of thermal expansion between the mother board 52 and the multi-layered ceramic substrate 82 of the multi-chip module 53-1. Accordingly, the module mounting area 90 tends to be warped due to the thermal stress. However, since the mother-board reinforcing member 60 is mounted on the front surface 52a of the mother board 52, the module mounting are 90 of the mother board 52 is prevented from being warped. Accordingly, the pins 84 are prevented from being separated from the pad terminals 91, and the soldered portion between each of the pins and the respective pad terminal 91 is effectively prevented from being destroyed.

Additionally, since the mother-board reinforcing member 60 mounted on the front surface 52a of the mother board 52, the overall height H of the system board device 50 is maintained to be small as shown in FIG. 7B. Accordingly, if the space for accommodating the system board device 50 in the large-scale computer 51 is small, the system board 50 can be accommodated without a problem.

Next, a description will be given of a characteristic structure of the mother-board reinforcing member 60.

Figure 9:
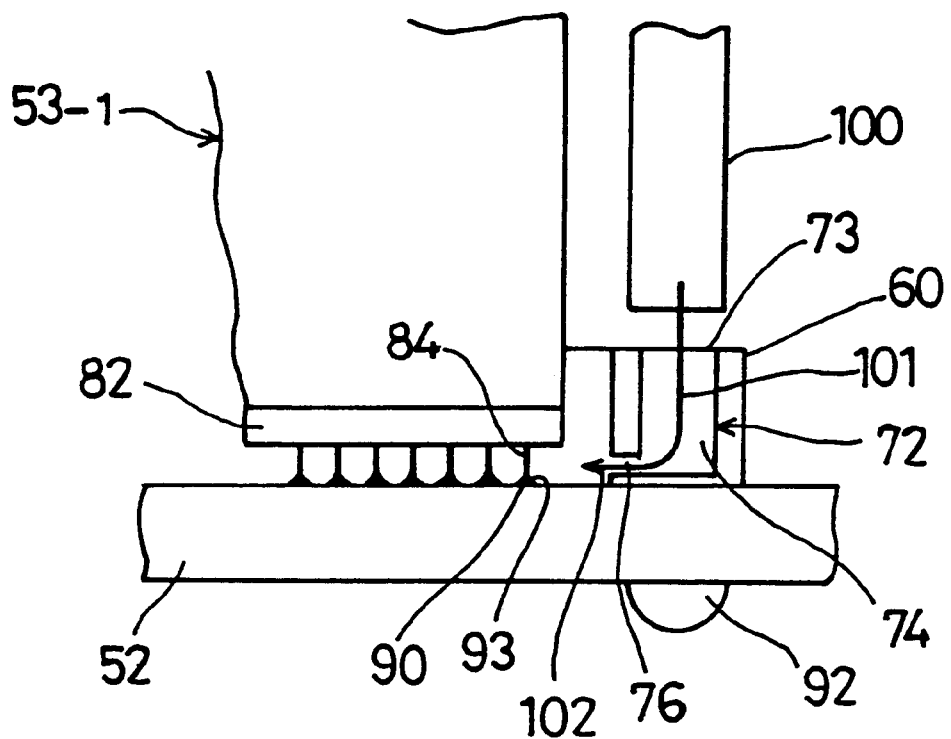
FIG. 9 is an illustration for explaining a replacement of the multi-chip module.

(1) A structure in which each of the side members 61 to 64 includes the nozzle structure 72:

If the multi-chip module 53-1 malfunctions and required to be replaced, a nozzle 100 having substantially the same size with the mother-board reinforcing member 60 is placed close to the mother-board reinforcing member 60 as shown in FIG. 9 so as to introducing hot air supplied by a hot fluid source (not shown in the figure) into the thermal fluid inlet port 73 of the nozzle structure 72 as indicated by an arrow 101 in FIG. 9. The hot air introduced into the heated fluid inlet port 73 flows through the fluid passage 74 and discharged from the heated air outlet port 76. The hot-air flow 102 discharged from the heated fluid outlet port 76 is directed to the solders 93 which connect the pins 84 to the pad terminals 90. Accordingly, the hot-air flow 102 reaches the solders 63 from each of the side members 61 to 64 surrounding the pins 84. Thus, the solders 93 of the pins 84 are melted so as to remove the multi-chip module 53-1 so that a new multi-chip module 53-1 is mounted on the mother board 52.

Figure 1:
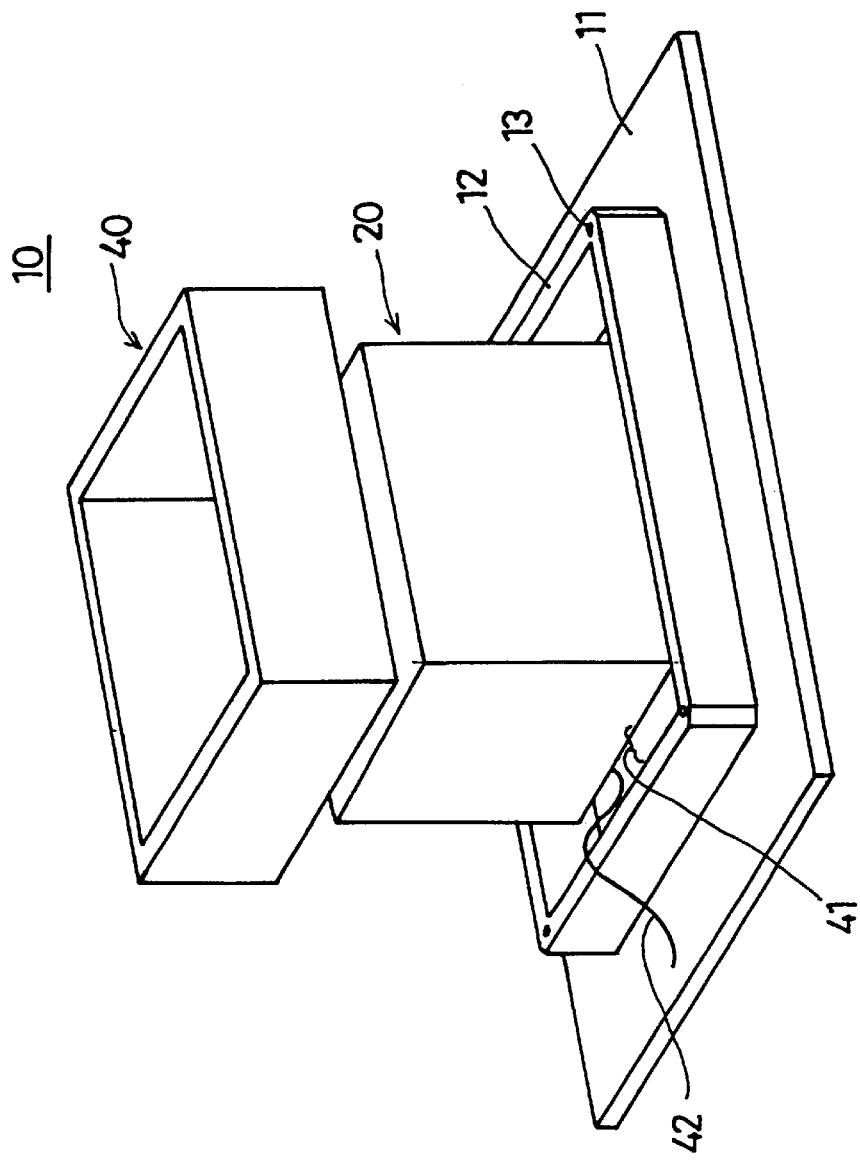
FIG. 1 is a perspective view of a conventional system board device.
Figure 2:
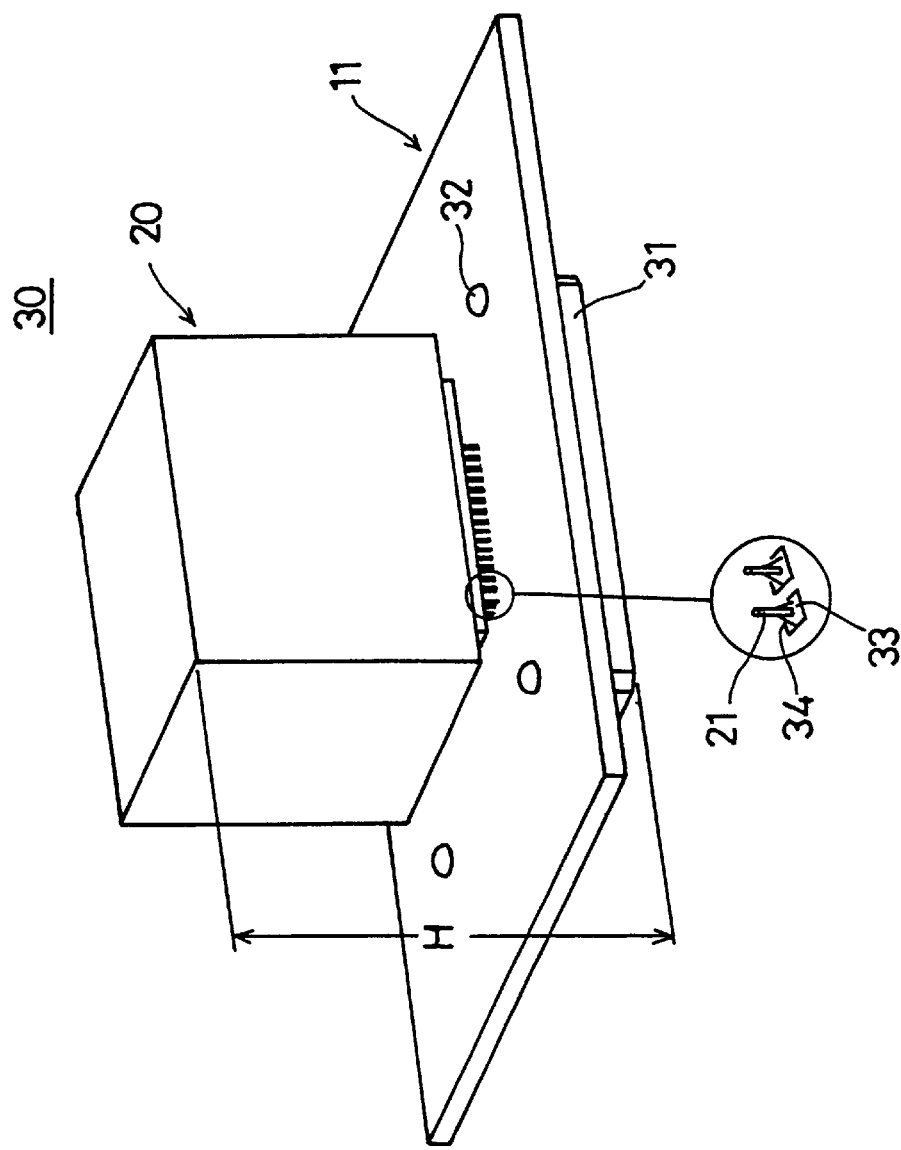
FIG. 2 is a perspective view of another conventional system board device.

In the system board device 50 according to the present embodiment, there is no need to provide the space 41 shown in FIG. 1. Accordingly, the size of the mother-board reinforcing member 60 is smaller than the size of the mother-board reinforcing member 12 provided in the conventional system board device shown in FIG. 1. Thus, the multi-chip module 53-1 can be positioned relative to the multi-chip module 53-2 with a minimized pitch P as shown in FIG. 4B. Similarly, the multi-chip module 53-3 and the multi-chip module 53-4 can be positioned with the minimized pitch P. Thus, the overall size of the system board device 50 according to the present embodiment can be reduced.

(2) A structure in which the fitting assist part 78 is provided:

When placing the multi-chip module 53-1 inside the mother-board reinforcing member 60, the multi-chip module 53-1 is moved downwardly by aligning the corner portions 85 of the multi-layered ceramic substrate 82 of the multi-chip module with the respective fitting assist parts 78. The corner portions 85 and the fitting assist parts 78 are viewable from above, and, thus, it is easy to fit the corner portions 85 to the respective fitting assist parts 78. Accordingly, the positioning pins 86 which are not seen from above can be accurately aligned with the respective positioning holes 94 which are also not seen from above. Thus, the positioning pins can be smoothly and accurately inserted into the respective positioning holes 94, and the operation for mounting the multi-chip module 53-1 is easy.

Figure 10A:
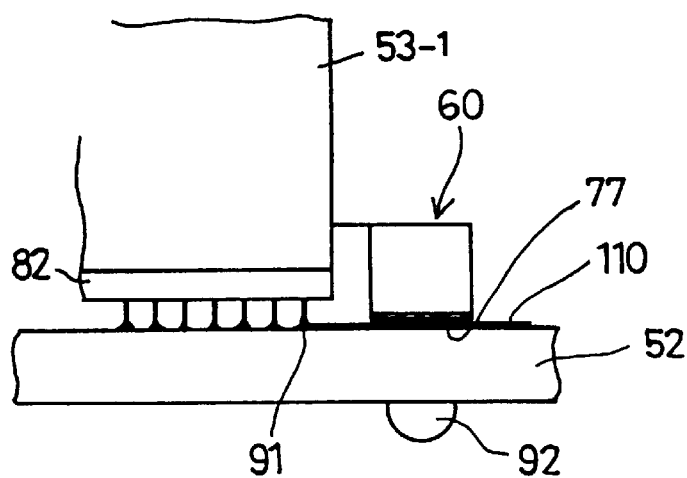
FIG. 10A is a side view of a part of the system board device for explaining a wire passing groove shown in FIG. 5.
Figure 10B:
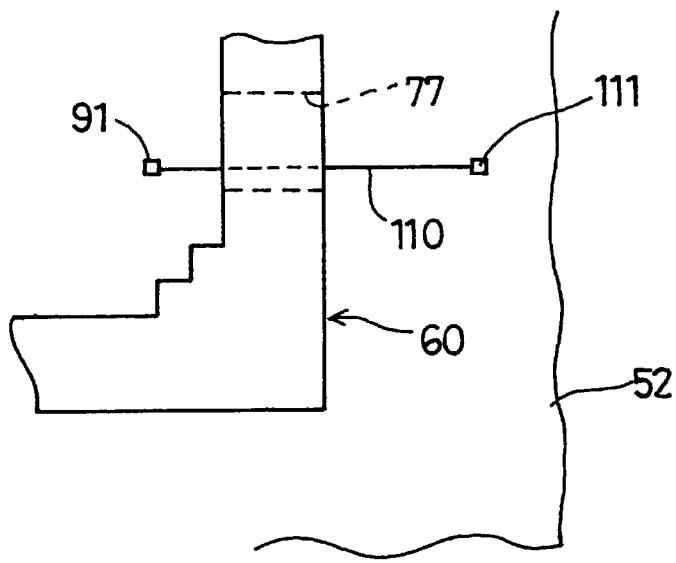
FIG. 10B is a plan view of the part of the system board device which part is shown in FIG. 10A.

(3) A structure in which the wire passing grooves 77 are provided:

As shown in FIGS. 10A and 10B, a wire 110 for modifying the mother board 52 has one end soldered to one of the pad terminals 91. The opposite end of the wire 110 is soldered to a pad 111 which is located outside the mother-board reinforcing member 60. That is, the wire 110 connects the one of the pad terminals 91 to the pad 111 by being extended through one of the wire passing grooves 77. Accordingly, the wire 110 extends along the front surface 52a of the mother board 52 in its entirety. This facilitates fixation of the wire 111 onto the mother board 52. Additionally, the wire 111 is prevented from being unintentionally cut off due to accidental catch by the multi-chip module 53-1 during, for example, an operation for replacing the multi-chip module 53-1 since the wire 111 does not have a part separated from the mother board 52.

It should be noted that although the above-mentioned mother-board reinforcing member 60 has the nozzle structure 72, the structure relating to the fitting assist parts 78 and the structure relating to the wire passing grooves 77, the mother-board reinforcing member 60 may have at least one of the nozzle structure 72, the structure relating to the fitting assist parts 78 and the structure relating to the wire passing grooves 77.

A description will now be given of variations of the above-mentioned mother-board reinforcing member 60.

Figure 11A:
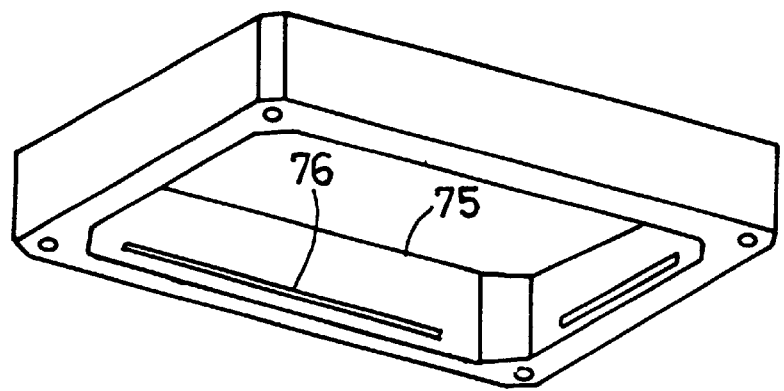
FIGS. 11A and 11B are perspective views of a first variation of the mother-board reinforcing member shown in FIG. 3.
Figure 11B:
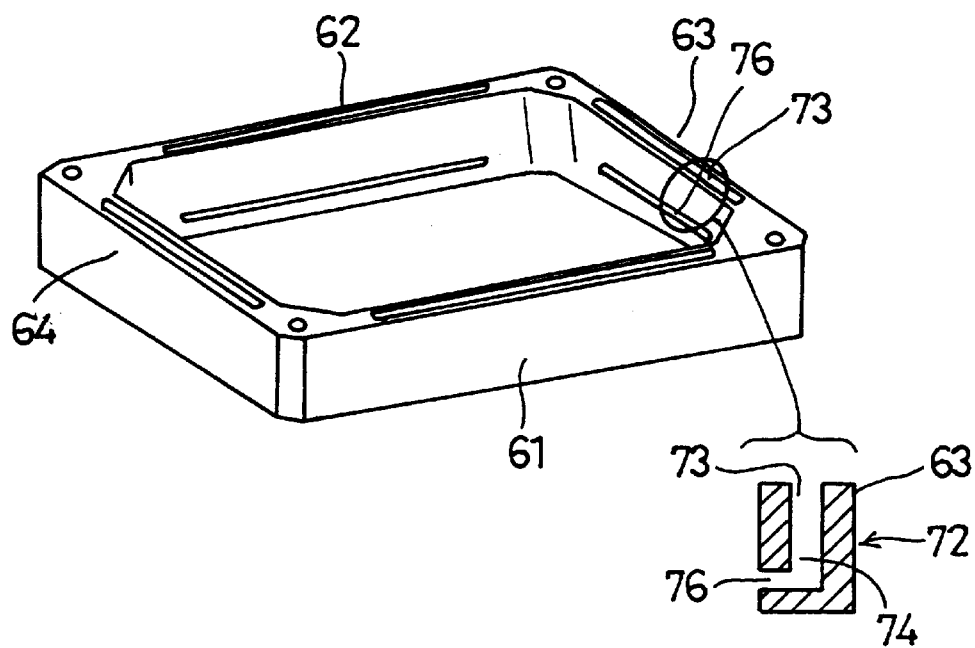

FIGS. 11A and 11B show a mother-board reinforcing member 60A which is a first variation of the mother-board reinforcing member 60 shown in FIG. 3. In FIGS. 11A and 11B, parts that are the same as the parts shown in FIGS. 8A and 8B are given the same reference numerals, and descriptions thereof will be omitted. As shown in FIGS. 11A and 11B, each of the side members 61 to 64 of the mother-board reinforcing member 60A has the above-mentioned nozzle structure 72.

Figure 12A:
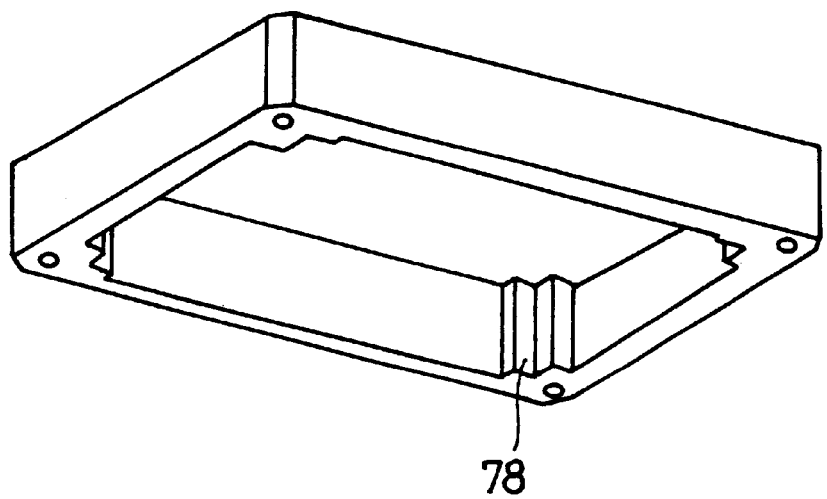
FIGS. 12A and 12B are perspective views of a second variation of the mother-board reinforcing member shown in FIG. 3.
Figure 12B:
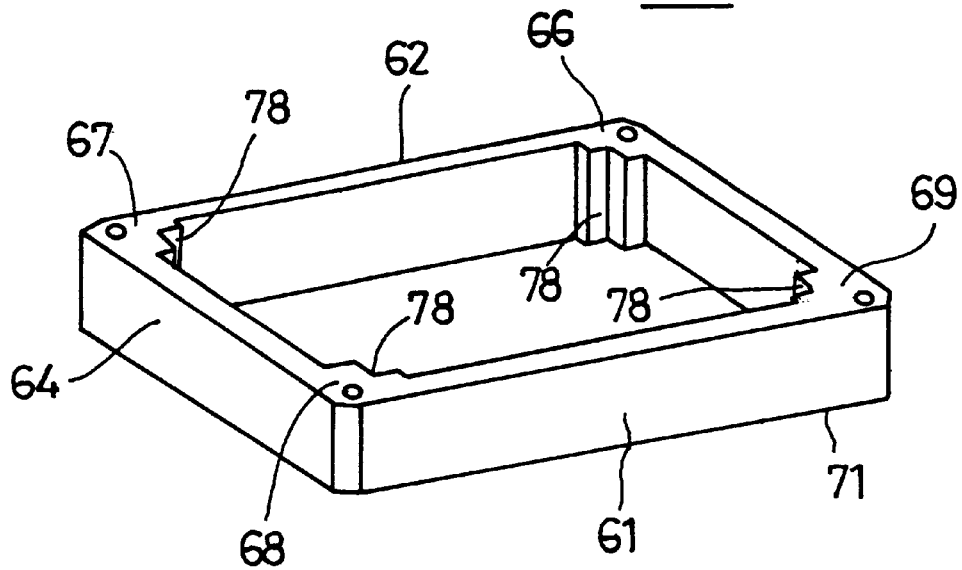

FIGS. 12A and 12B show a mother-board reinforcing member 60B which is a second variation of the mother-board reinforcing member 60 shown in FIG. 3. In FIGS. 12A and 12B, parts that are the same as the parts shown in FIGS. 8A and 8B are given the same reference numerals, and descriptions thereof will be omitted. As shown in FIGS. 12A and 12B, the mother-board reinforcing member 60B has the fitting assist part 78 at each of the corner portions 66 to 69.

Figure 13A:
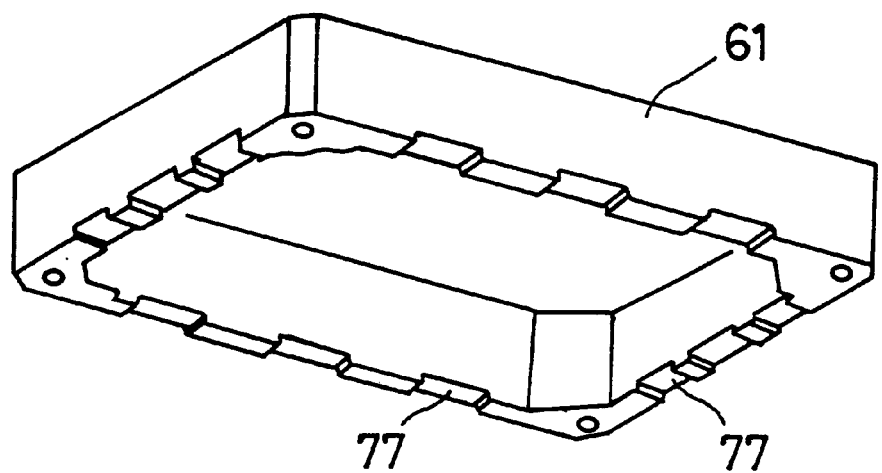
FIGS. 13A and 13B are perspective views of a third variation of the mother-board reinforcing member shown in FIG. 3.
Figure 13B:
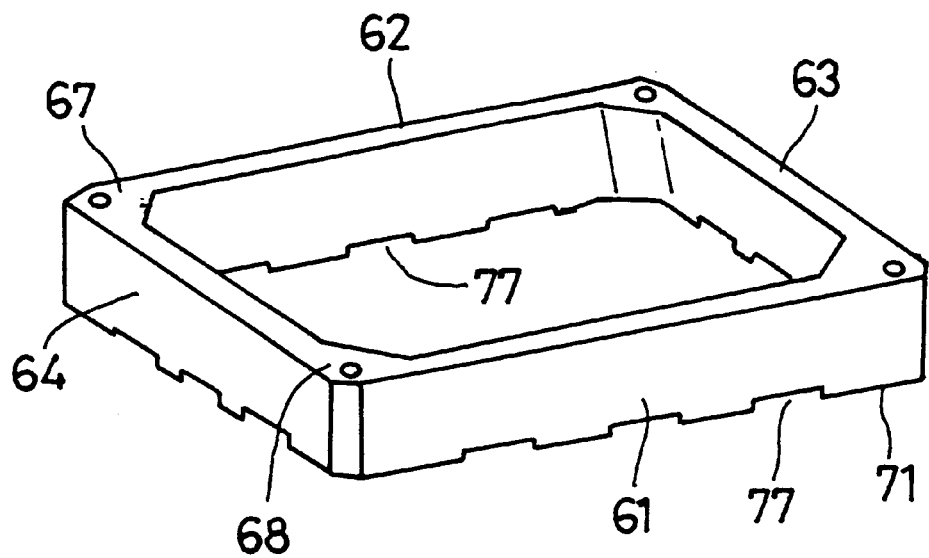

FIGS. 13A and 13B show a mother-board reinforcing member 60C which is a third variation of the mother-board reinforcing member 60 shown in FIG. 3. In FIGS. 13A and 13B, parts that are the same as the parts shown in FIGS. 8A and 8B are given the same reference numerals, and descriptions thereof will be omitted. As shown in FIGS. 13A and 13B, the mother-board reinforcing member 60C has the above-mentioned structure relating to the wire passing grooves 77.

Figure 14A:
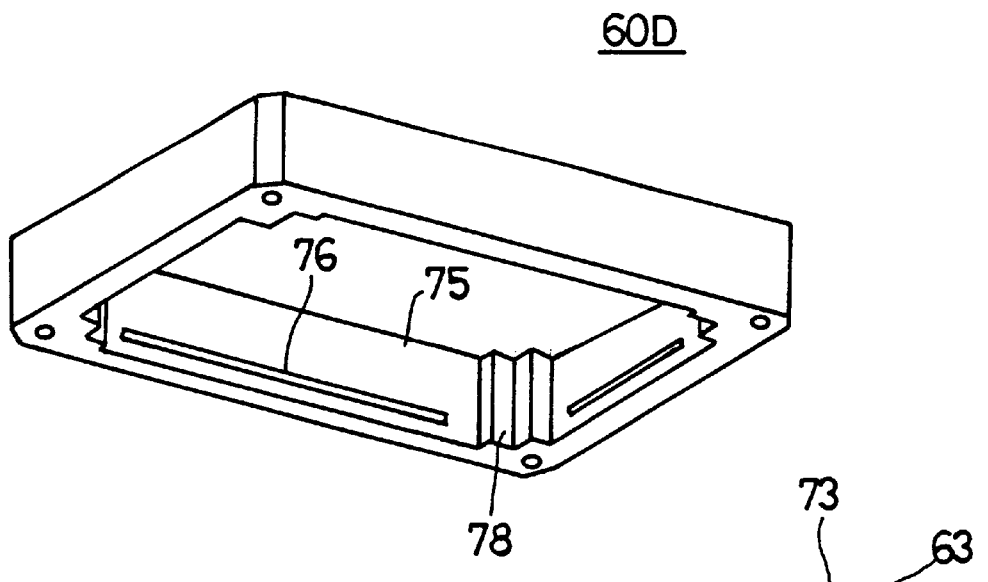
FIGS. 14A and 14B are perspective views of a fourth variation of the mother-board reinforcing member shown in FIG. 3.
Figure 14B:
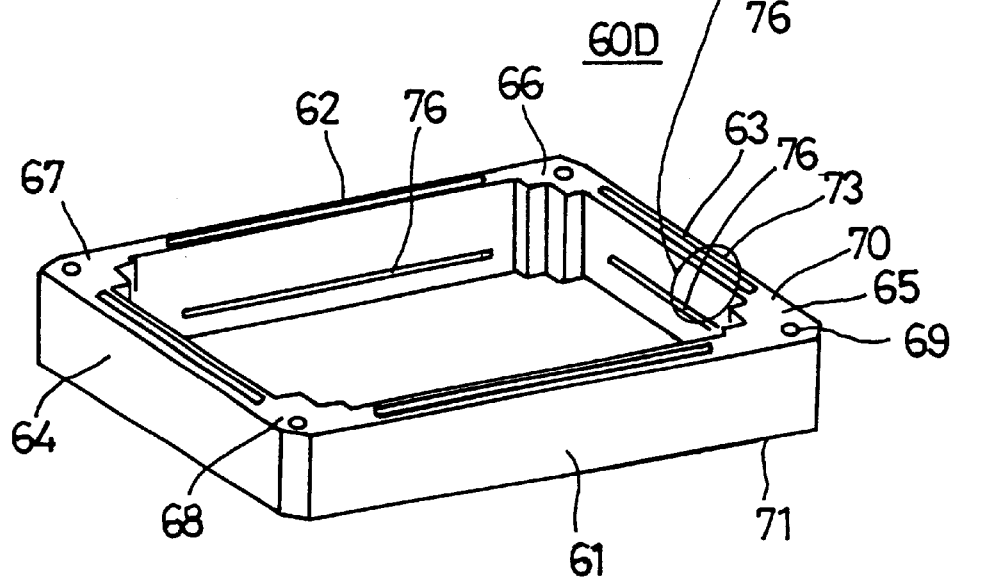

FIGS. 14A and 14B show a mother-board reinforcing member 60D which is a fourth variation of the mother-board reinforcing member 60 shown in FIG. 3. In FIGS. 14A and 14B, parts that are the same as the parts shown in FIGS. 8A and 8B are given the same reference numerals, and descriptions thereof will be omitted. As shown in FIGS. 14A and 14B, the mother-board reinforcing member 60D has the structure relating to the fitting assist parts 78 and each of the side members 61 to 64 of the mother-board reinforcing member 60D has the above-mentioned nozzle structure 72.

Figure 15A:
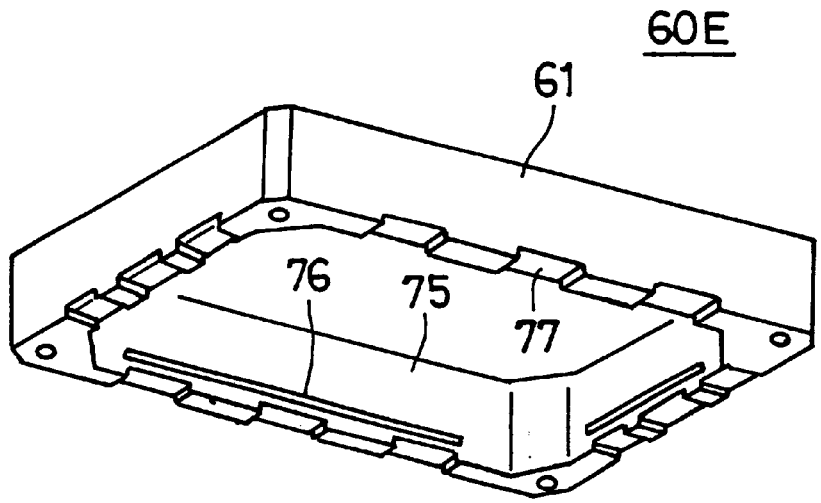
FIGS. 15A and 15B are perspective views of a fifth variation of the mother-board reinforcing member shown in FIG. 3.
Figure 15B:
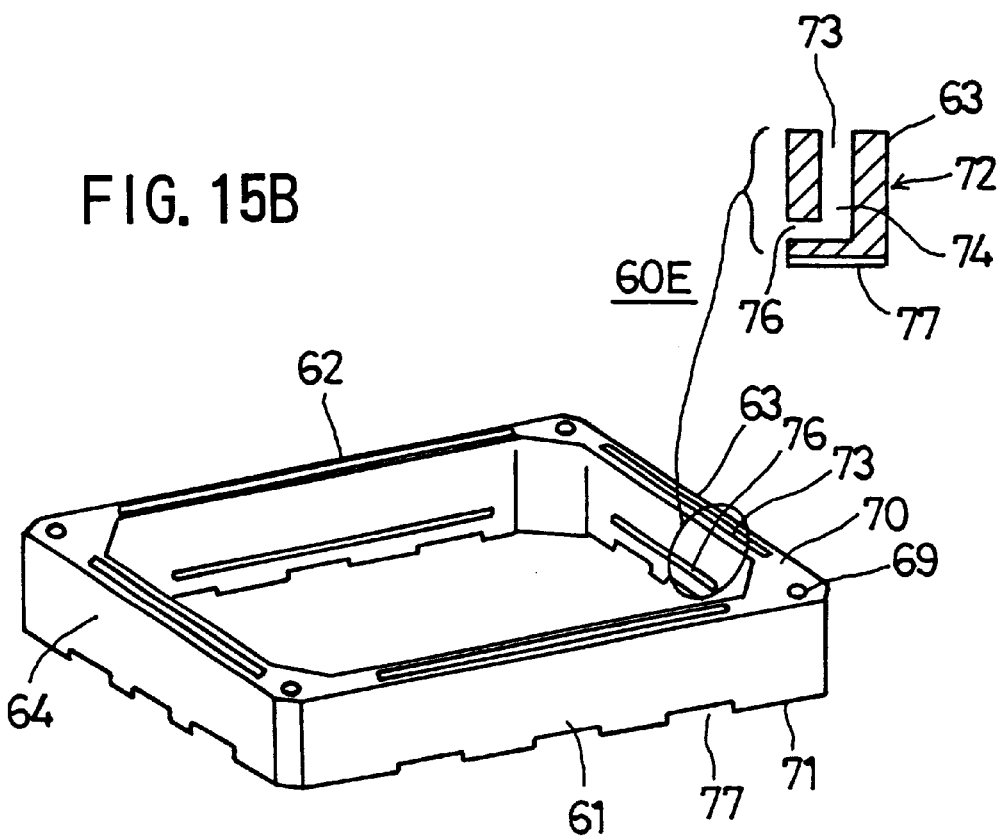

FIGS. 15A and 15B show a mother-board reinforcing member 60E which is a fifth variation of the mother-board reinforcing member 60 shown in FIG. 3. In FIGS. 15A and 15B, parts that are the same as the parts shown in FIGS. 8A and 8B are given the same reference numerals, and descriptions thereof will be omitted. As shown in FIGS. 15A and 15B, each of the side members 61 to 64 of the mother-board reinforcing member 60E has the above-mentioned nozzle structure 72 and the wire passing grooves 77.

Figure 16A:
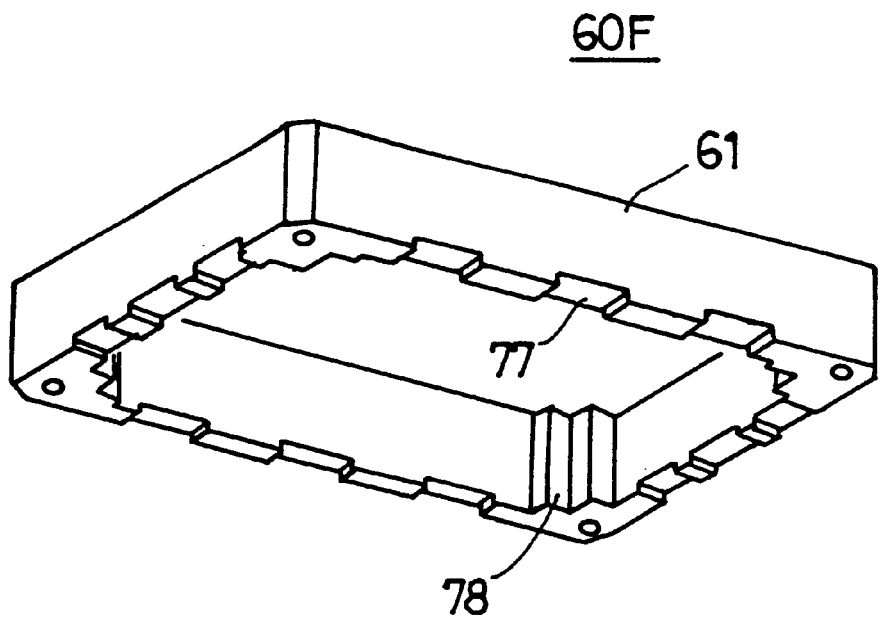
FIGS. 16A and 16B are perspective views of a sixth variation of the mother-board reinforcing member shown in FIG.3.
Figure 16B:
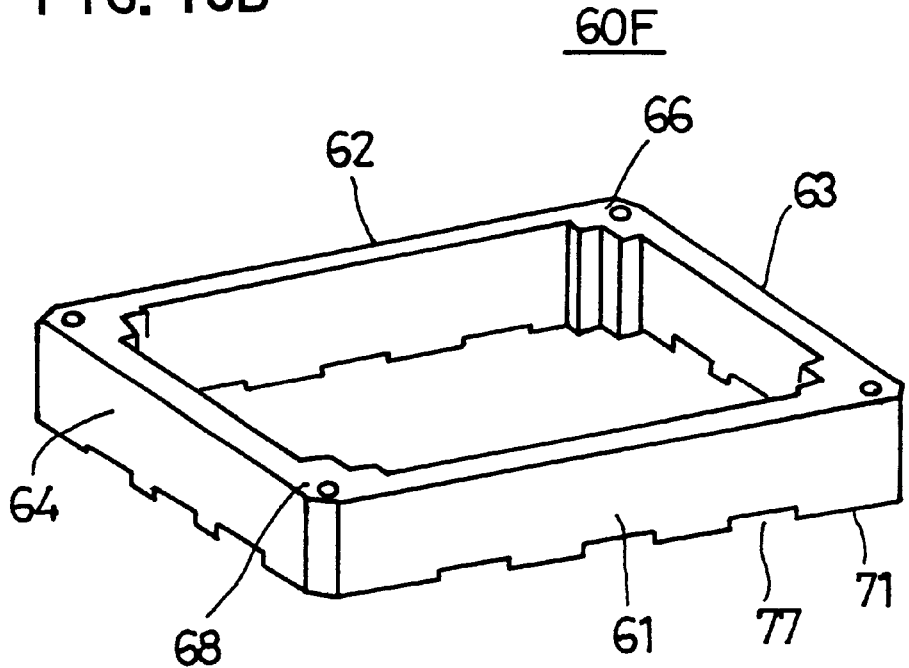

FIGS. 16A and 16B show a mother-board reinforcing member 60F which is a sixth variation of the mother-board reinforcing member 60 shown in FIG. 3. In FIGS. 16A and 16B, parts that are the same as the parts shown in FIGS. 8A and 8B are given the same reference numerals, and descriptions thereof will be omitted. As shown in FIGS. 16A and 16B, each of the side members 61 to 64 of the mother-board reinforcing member 60F has both the structure relating to the fitting assist parts 78 and the structure relating to the wire passing grooves 77.

It should be noted that, in the above-mentioned embodiment and the variations thereof, the multi chip module may be a ball-grid array type.

The present invention is not limited to the specifically disclosed embodiments, and variations and modifications may be made without departing from the scope of the present invention.

The present application is based on Japanese priority application No. 10-225883 filed on Aug. 10, 1998, the entire contents of which are hereby incorporated by reference.

What is claimed is:

1. A printed-circuit board reinforcing member adapted to be mounted on a surface of a printed-circuit board for reinforcing a part of the printed-circuit board, said printed-circuit board reinforcing member having a square frame shape having four side members, an electronic part having a square shape being mounted on a part of the surface of said printed-circuit board so that the part of the surface of the printed-circuit board is surrounded by said printed-circuit board reinforcing member, said printed-circuit board reinforcing member comprising:

an inlet port formed on a top surface of each of said side members;

an outlet port formed on an inner surface of each of said side members; and a fluid passage provided in each of said side members so as to connect said inlet port to said outlet port, wherein heated fluid introduced into said inlet port is discharged from said outlet port so as to heat connecting parts between said electronic part and said printed-circuit board.

2. The printed-circuit board reinforcing member as claimed in claim 1, further comprising:

at least one wire passing groove formed on a surface of said printed-circuit board reinforcing member opposite to the surface of said printed-circuit board so that a wire is extended through said wire passing groove when said wire is required to be extend from an inner side of said printed-circuit board reinforcing member to an outer side of said printed-circuit board reinforcing member.

3. The printed-circuit board reinforcing member as claimed in claim 1, further comprising:

a fitting assist part formed on an inner side of each corner of said printed-circuit board reinforcing member, said fitting assist part guiding each corner of said electronic part when said electronic part is being placed inside said printed-circuit board reinforcing member so as to facilitate insertion of a positioning pin protruding from said electronic part into a positioning hole formed in said printed-circuit board.

4. The printed-circuit board reinforcing member as claimed in claim 3, further comprising:

at least one wire passing groove formed on a surface of said printed-circuit board reinforcing member opposite to the surface of said printed-circuit board so that a wire is extended through said wire passing groove when said wire is required to be extend from an inner side of said printed-circuit board reinforcing member to an outer side of said printed-circuit board reinforcing member.

5. A printed-circuit board reinforcing member adapted to be mounted on a surface of a printed-circuit board for reinforcing a part of the printed-circuit board, said printed-circuit board reinforcing member having a square frame shape having four side members, an electronic part having a square shape being mounted on a part of the surface of said printed-circuit board so that the part of the surface of the printed-circuit board is surrounded by said printed-circuit board reinforcing member, said printed-circuit board reinforcing member comprising:

a fitting assist part formed on an inner side of each of said corners, said fitting assist part guiding each corner of said electronic part when said electronic part is placed inside said printed-circuit board reinforcing member so as to facilitate insertion of a positioning pin protruding from said electronic part into a positioning hole formed in said printed-circuit board.

6. A printed-circuit board reinforcing member adapted to be mounted on a surface of a printed circuit board for reinforcing a part of the printed-circuit board, said printed-circuit board reinforcing member having a square frame shape having four side members, an electronic part having a square shape being mounted on a part of the surface of said printed-circuit board so that the part of the surface of the printed-circuit board is surrounded by said printed-circuit board reinforcing member, said printed-circuit board reinforcing member comprising:

at least one wire passing groove formed on a surface of said printed-circuit board reinforcing member which surface is opposite to the surface of said printed-circuit board so that a wire is extended through said wire passing groove and along the surface of said printed-circuit board when said wire is required to be extend from an inner side of said printed-circuit board reinforcing member to an outer side of said printed-circuit board reinforcing member.

7. A system board device comprising:

a printed-circuit board having a plurality of terminals thereon;

an electronic part having a square shape, said electronic part having a plurality of terminals connected to the terminals of said printed circuit board by soldering; and a printed-circuit board reinforcing member mounted on a surface of said printed-circuit board for reinforcing a part of the printed-circuit board, said printed-circuit board reinforcing member having a square frame shape having four side members, said electronic part being mounted on a part of the surface of said printed-circuit board so that the part of the surface of the printed-circuit board is surrounded by said printed-circuit board reinforcing member, said printed-circuit board reinforcing member including:

an inlet port formed on a top surface of each of said side members;

an outlet port formed on an inner surface of each of said side members; and a fluid passage provided in each of said side members so as to connect said inlet port to said outlet port, wherein heated fluid introduced into said inlet port is discharged from said outlet port so as to heat a soldered portion provided between the terminals of said electronic part and the terminals of said printed-circuit board.

8. The system board device as claimed in claim 7, wherein said printed-circuit board reinforcing member further comprises:

at least one wire passing groove formed on a surface of said printed-circuit board reinforcing member opposite to the surface of said printed-circuit board so that a wire is extended through said wire passing groove when said wire is required to be extend from an inner side of said printed-circuit board reinforcing member to an outer side of said printed-circuit board reinforcing member.

9. The system board device as claimed in claim 7, wherein said printed-circuit board reinforcing member further comprises:

a fitting assist part formed on an inner side of each corner of said printed-circuit board reinforcing member, said fitting assist part guiding each corner of said electronic part when said electronic part is being placed inside said printed-circuit board reinforcing member so as to facilitate insertion of a positioning pin protruding from said electronic part into a positioning hole formed in said printed-circuit board.

10. The system board device as claimed in claim 9, wherein said printed-circuit board further comprises:

at least one wire passing groove formed on a surface of said printed-circuit board reinforcing member opposite to the surface of said printed-circuit board so that a wire is extended through said wire passing groove when said wire is required to be extend from an inner side of said printed-circuit board reinforcing member to an outer side of said printed-circuit board reinforcing member.

* * * * *